United States Patent
Kim et al.

(10) Patent No.: US 8,154,135 B2
(45) Date of Patent: Apr. 10, 2012

(54) STACKED SEMICONDUCTOR PACKAGE

(75) Inventors: Jong Hoon Kim, Gyeonggi-do (KR); Ho Young Son, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 229 days.

(21) Appl. No.: 12/491,651

(22) Filed: Jun. 25, 2009

(65) Prior Publication Data

US 2010/0258936 A1 Oct. 14, 2010

(30) Foreign Application Priority Data

Apr. 10, 2009 (KR) .................. 10-2009-0031414

(51) Int. Cl.
*H01L 23/48* (2006.01)
*H01L 29/40* (2006.01)

(52) U.S. Cl. ........ 257/774; 257/777; 257/692; 257/686; 257/E23.011; 257/E23.067; 257/E33.062

(58) Field of Classification Search .................. 257/623, 257/777, 774, 686, 692, 788, E25.006, E25.013, 257/E25.018, E25.021, E25.027; 438/109, 438/667

See application file for complete search history.

(56) References Cited

U.S. PATENT DOCUMENTS

| | | | |
|---|---|---|---|
| 5,686,763 A * | 11/1997 | Tokuno et al. | 257/777 |
| 6,235,554 B1 | 5/2001 | Akram et al. | |
| 6,812,580 B1 * | 11/2004 | Wenzel et al. | 257/784 |
| 7,675,153 B2 * | 3/2010 | Kurosawa et al. | 257/686 |
| 7,795,139 B2 * | 9/2010 | Han et al. | 438/639 |
| 2003/0137062 A1 * | 7/2003 | Akram et al. | 257/788 |
| 2005/0263869 A1 * | 12/2005 | Tanaka et al. | 257/686 |

FOREIGN PATENT DOCUMENTS

| | | |
|---|---|---|
| JP | 2006-216691 A | 8/2006 |
| JP | 2008-226926 A | 9/2008 |
| KR | 1020050028713 A | 3/2005 |
| KR | 1020080114060 A | 12/2008 |

\* cited by examiner

*Primary Examiner* — Kiesha Bryant
*Assistant Examiner* — Abbigale Boyle
(74) *Attorney, Agent, or Firm* — Ladas & Parry LLP

(57) ABSTRACT

A stacked semiconductor package is presented which includes multiple semiconductor chips and through-electrodes. Each semiconductor chip has bonding pads formed on a first surface of the semiconductor chip and has a projection which projects from a portion of a second surface of the semiconductor chip. The first and second surfaces of the semiconductor chip face away from each other the first surface. The through-electrodes pass through the first surface and through the projection on the second surface.

18 Claims, 5 Drawing Sheets

STACKED SEMICONDUCTOR PACKAGE

CROSS-REFERENCE TO RELATED APPLICATIONS

The present application claims priority to Korean patent application number 10-2009-0031414 filed on Apr. 10, 2009, which is incorporated herein by reference in its entirety.

BACKGROUND OF THE INVENTION

The present invention relates to a semiconductor package, more particularly to a semiconductor package having a plurality of chips stacked upon each other.

These days, semiconductor chips capable of storing and processing huge amount of data and semiconductor packages having these semiconductor chips have been developed.

Recently, a stacked semiconductor package, in which at least two semiconductor chips are stacked so as to increase data storage capacity and/or data processing speed, has been proposed in the art.

In order to realize the stacked semiconductor package, stacking technology for stacking semiconductor chips and gap-fill technology for filling the voids with gap-fill material between the stacked semiconductor chips are necessarily required.

As the gap between the stacked semiconductor chips gradually decreases, it becomes increasingly more difficult to completely fill in these voids with the gap-fill material between the semiconductor chips. Due to this fact, voids are likely to persist or be created between the stacked semiconductor chips. The voids created between the semiconductor chips can cause various defects which can be detected by conducting various reliability tests of the stacked semiconductor package and/or the results of these defects can be unwittingly encountered during the operation of these stacked semiconductor packages.

BRIEF SUMMARY OF THE INVENTION

Embodiments of the present invention are directed to a semiconductor package which is suitable for preventing voids or at least minimizing the occurrence between stacked semiconductor chips.

In one aspect of the present invention, a semiconductor package comprises a semiconductor chip having bonding pads which are formed on a first surface of the semiconductor chip and a projection which projects from a portion of a second surface of the semiconductor chip, facing away from the first surface; and through-electrodes passing through the first surface and the projection on the second surface.

The projection is placed at a middle portion of the second surface while having a rectangular shape when viewed from the bottom, and the projection and the semiconductor chip are formed integrally with each other.

The projection is placed on the second surface in the form of a matrix like pattern when viewed from the bottom, and the projection and the semiconductor chip are formed integrally with each other.

The semiconductor package further comprises a reinforcing layer placed on the projection.

The through-electrodes pass through the reinforcing layer, and the reinforcing layer comprises any one of a non-conductive adhesive (NCA), a non-conductive film (NCF) and a non-conductive polymer (NCP).

The reinforcing layer comprises an anisotropic conductive film (ACF).

The semiconductor package may further comprises at least one guide member projecting from the second surface of the semiconductor chip in such a way as to be parallel to one of a short side and a long side of the semiconductor chip.

The projection preferably occupies 5~25% of an overall area of the second surface.

At least two through-electrodes pass through the semiconductor chip in correspondence to the projection.

The semiconductor package may further comprise any ones of bumps and/or pads placed on ends of the through-electrodes which correspond to the projection.

The bumps and pads are preferably formed of any one selected from the group consisting of solder, gold, copper and aluminum.

At least two semiconductor chips are stacked, and the first surface and the second surface of the respective stacked semiconductor chips are placed facing each other.

The semiconductor package further comprises coating layers placed on the first surface and second surface and containing any one of a hydrophilic substance and a lipophilic substance.

The semiconductor package further comprises a gap-fill member interposed between the stacked semiconductor chips and containing any one of a hydrophilic substance and a lipophilic substance in correspondence to the coating layer.

In another aspect of the present invention, a semiconductor package comprises a semiconductor chip having a first surface on which bonding pads are placed and a second surface which has a flat part and recessed parts. The semiconductor chip having a first thickness when measured from the first surface to the flat part and a second thickness when measured from the recessed parts to the first surface in which the second thickness is less than the first thickness; and through-electrodes passing through the first surface and the flat part.

The semiconductor package may further comprise a reinforcing layer placed on the flat part.

The semiconductor package may further comprise at least one guide member projecting from the second surface of the semiconductor chip parallel to one of a short side and a long side of the semiconductor chip.

At least two semiconductor chips are stacked, and the first surface and the second surface of the respective stacked semiconductor chips are placed facing each other.

The semiconductor package may further comprise coating layers placed on the first surface and second surface and containing any one of a hydrophilic substance and a lipophilic substance.

The semiconductor package may further comprise a gap-fill member interposed between the stacked semiconductor chips and containing any one of a hydrophilic substance and a lipophilic substance in correspondence to the coating layer.

DESCRIPTION OF SPECIFIC EMBODIMENTS

Figure 1:
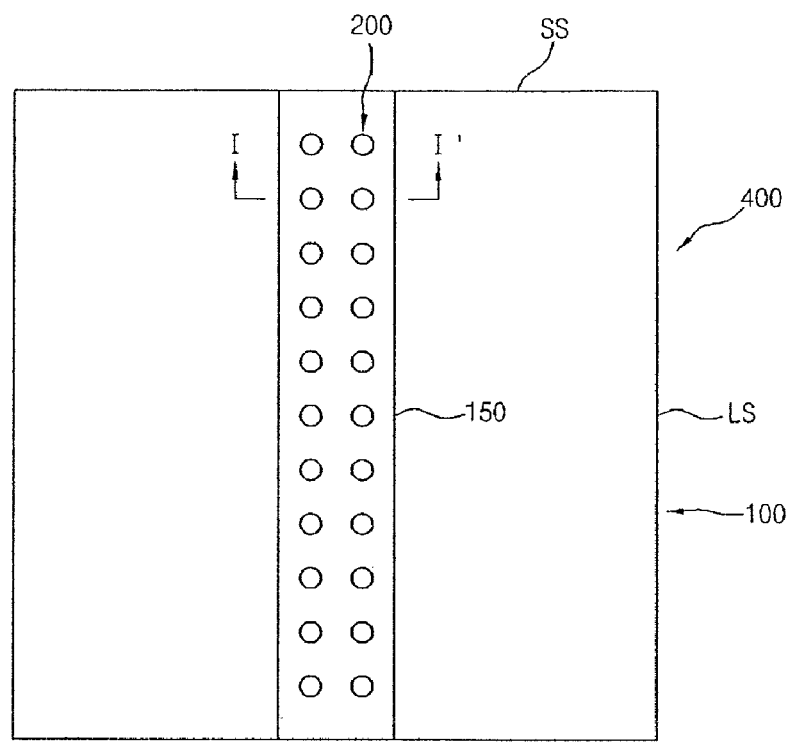
FIG. 1 is a bottom view illustrating a semiconductor package in accordance with a first embodiment of the present invention.
Figure 2:
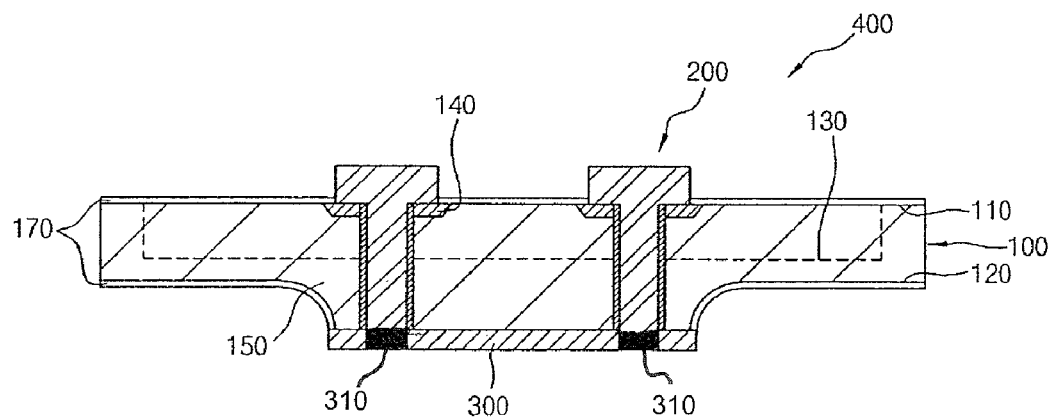
FIG. 2 is a sectional view taken along the line I-I' of FIG. 1.

It is understood herein that the drawings are not necessarily to scale and in some instances proportions may have been exaggerated in order to more clearly depict certain features of the invention. FIG. 1 is a bottom view illustrating a semiconductor package in accordance with a first embodiment of the present invention. FIG. 2 is a sectional view taken along the line I-I' of FIG. 1.

Referring to FIGS. 1 and 2, a semiconductor package 400 includes a semiconductor chip 100 and through-electrodes 200 which can optionally have bumps and pads 310 at the ends of the through-electrodes 200. In addition, the semiconductor package 400 can further include a reinforcing layer 300.

For example, the semiconductor chip 100 has the shape of a rectangular hexahedron which possesses long sides LS and short sides SS. The semiconductor chip 100, which has the shape of a rectangular hexahedron, has a first surface 110 and a second surface 120 which face away from each other.

The semiconductor chip 100 includes a circuit section 130, bonding pads 140, and a projection 150.

The circuit section 130 is placed in the semiconductor chip 100. The circuit section 130 has a data processing unit (not shown) for processing data and a data storage unit (not shown) for storing data.

The bonding pads 140 are placed on the first surface 110 of the semiconductor chip 100. The respective bonding pads 140 are electrically connected with the circuit section 130.

The projection 150 is formed on the second surface 120 of the semiconductor chip 100. The projection 150 projects form a portion of the second surface 120 at a predetermined thickness.

In the present embodiment, the projection 150 can have various numbers and various shapes.

When viewed from the bottom, the projection 150 can have a rectangular shape. The projection 150 can be placed at the middle portion of the second surface 120 of the semiconductor chip 100 to extend in a direction parallel to the long sides LS or the short sides SS. For example, in the present illustrative embodiment, the projection 150 is disposed at the middle portion of the second surface 120 so that it extends in a direction substantially parallel to the long sides LS. Also, at least two projections 150 can be arranged in parallel to each other (as shown) or can be arranged to cross one another. In the present embodiment, the projection 150 is formed integrally with the semiconductor chip 100.

In the present embodiment, the projection 150 occupies about 5~25% of the surface area of the second surface 120 of the semiconductor chip 100. If the projection 150 occupies less than 5% of the surface area of the second surface 120, when the semiconductor chip 100 is stacked, the semiconductor chip 100 is prone to leaning along one side or the other. Also, if the projection 150 occupies greater than 25% of the surface area of the second surface 120, the area of the circuit section 130 can decrease.

Figure 3:
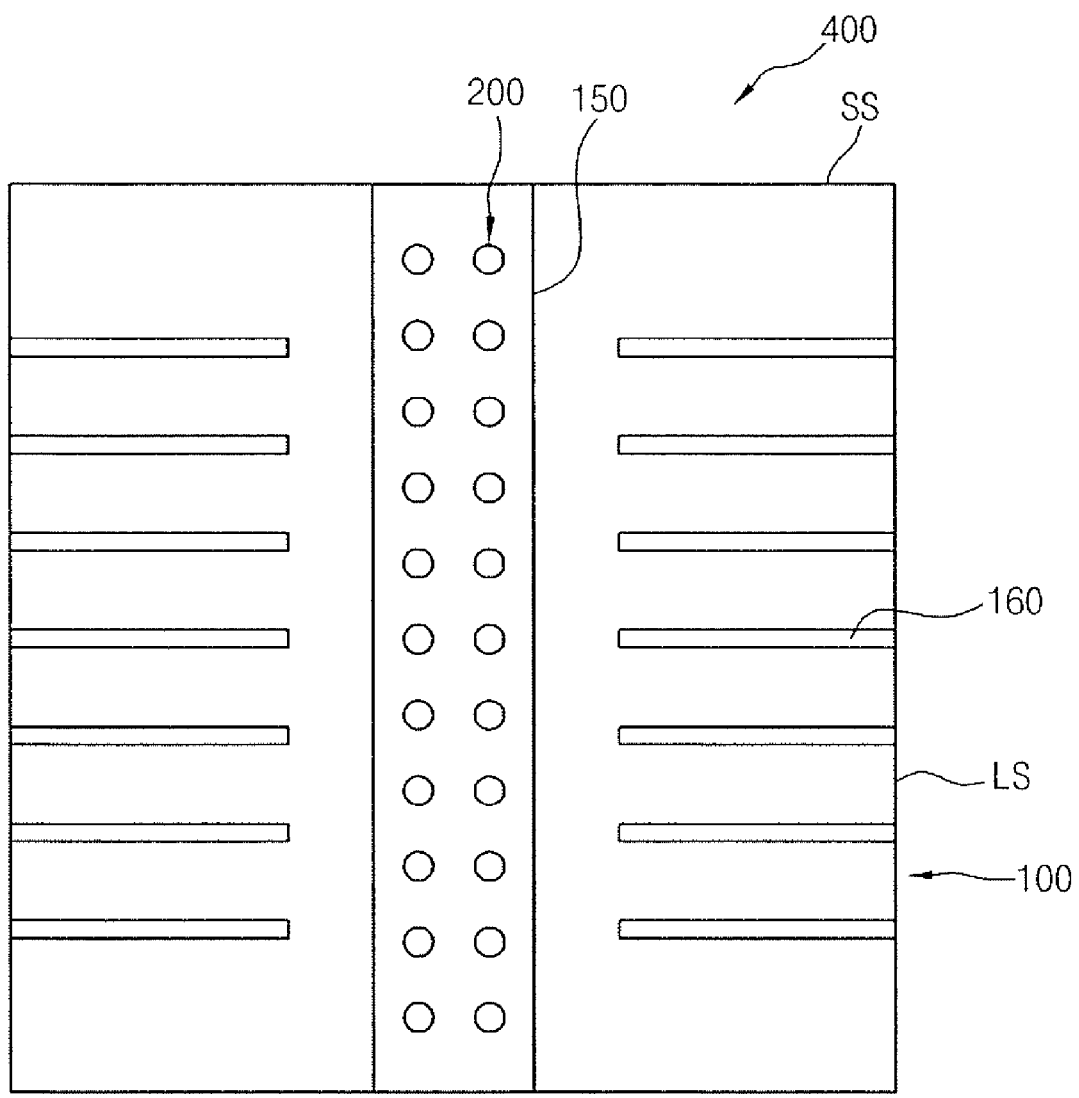
FIG. 3 is a bottom view illustrating guide members which are formed on the second surface of the semiconductor chip shown in FIG. 2.

FIG. 3 is a bottom view illustrating guide members which are formed on the second surface 120 of the semiconductor chip 100 as shown in FIG. 2.

Referring to FIG. 3, one or more guide members 160 are placed on the second surface 120 of the semiconductor chip 100. The guide members 160 project outwards away from the second surface 120 by a preset thickness. In the present embodiment, at least two guide members 160 are placed in parallel on the short side SS. For example, the guide members 160 have a thickness which is less than that of the projection 150.

The guide members 160 allow a liquid phase gap-fill member to flow in the direction parallel to the short side SS, thereby preventing or at least minimizing the occurrence of voids from being created.

Although it is described and illustrated in the present embodiment that the guide members 160 are placed to be parallel to the short side SS of the semiconductor chip 100, it is also envisioned that the guide members 160 can be placed in parallel to the long sides LS of the semiconductor chip 100. Unlike this, the guide members 160 can of course be formed to be inclined with respect to the long sides LS.

Figure 4:
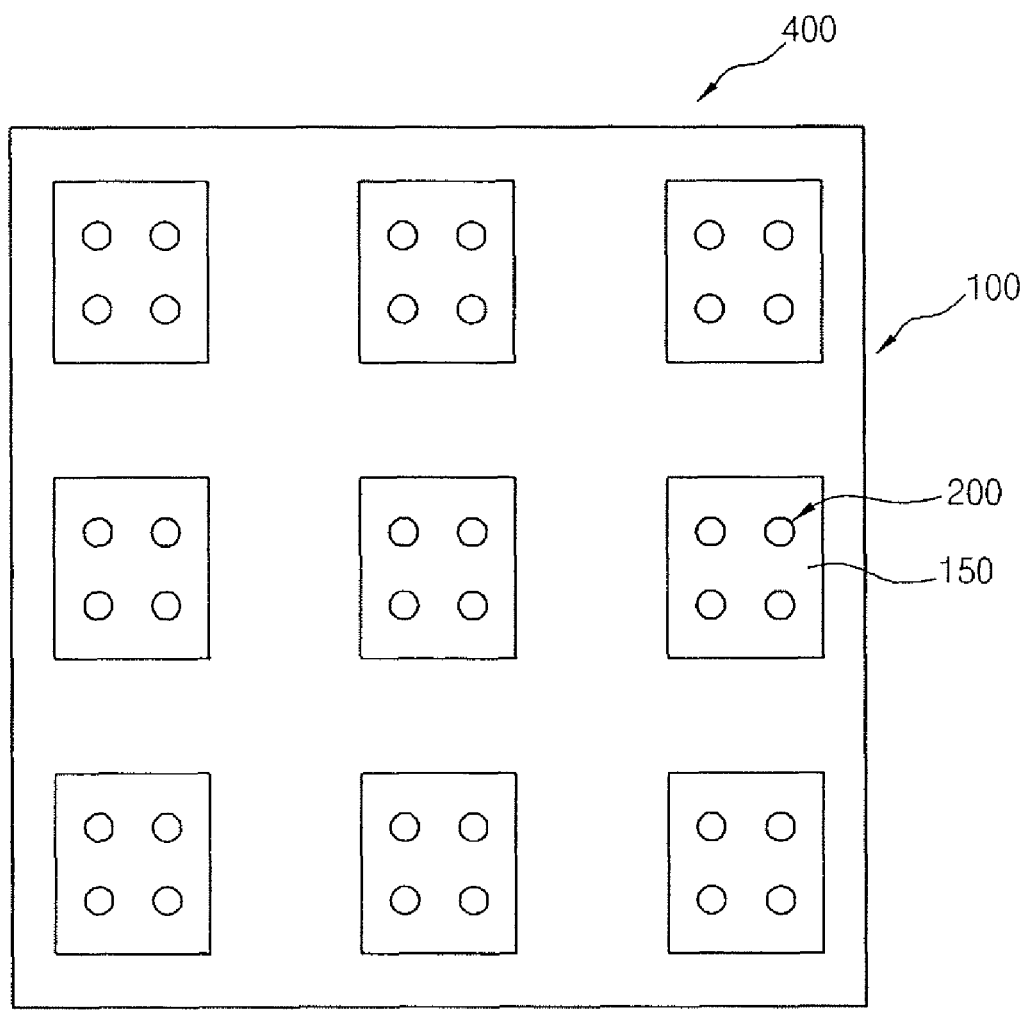
FIG. 4 is a bottom view illustrating a variation of the projection shown in FIG. 2.

FIG. 4 is a bottom view illustrating a variation of the projection shown in FIG. 2.

Referring to FIG. 4, at least two projections 150 are placed on the second surface 120 of the semiconductor chip 100. The projections 150 are placed on the second surface 120 to define a symmetrical matrix pattern. In the present embodiment, the projections 150 are placed on the second surface 120 of the semiconductor chip 100 to define the form of a 3×3 matrix pattern.

Referring again to FIG. 2, the through-electrodes 200 pass through the first surface 110 and the second surface 120 of the semiconductor chip 100. In the present embodiment, the through-electrodes 200 can pass through and be electrically connected with the bonding pads 140 which are placed on the first surface 110 of the semiconductor chip 100. Unlike this depiction, it is also conceivable that the through-electrodes 200 and the bonding pads 140 can be separated from one another at a predetermined distance and are electrically connected with each other by using redistribution lines (not shown).

The ends of the through-electrodes 200, which correspond to the projection 150 of the semiconductor chip 100, can project from the projection 150 by a predefined thickness.

The reinforcing layer 300 is placed on the projection 150 of the semiconductor chip 100. In the present embodiment, the reinforcing layer 300 can comprise, for example, any one of a non-conductive adhesive (NCA), a non-conductive film (NCF) and a non-conductive polymer (NCP).

When the reinforcing layer 300 comprises any one of an NCA, an NCF and an NCP, portions of the reinforcing layer 300, which correspond to the through-electrodes 200, are defined with openings, and the through-electrodes 200 are placed in the openings. In the present embodiment, the ends of the through-electrodes 200 are preferably flush with the surface of the reinforcing layer 300. Unlike this, the ends of the through-electrodes 200 can be flush with the surface of the projection 150, and bumps and pads 310, which are preferably formed of solder or gold, can be placed in the openings which are defined in the reinforcing layer 300. Still unlike this depiction, it is also envisioned that the ends of the through-electrodes 200 can be flush with the surface of the projection 150, and connection bumps and pads 310 which are electrically connected with the through-electrodes 200 can be placed in the openings which are defined in the reinforcing layer 300.

Meanwhile, when the reinforcing layer 300 comprises an anisotropic conductive film (ACF), the reinforcing layer 300 does not have openings, and the ends of the through-electrodes 200 which correspond to the projection 150 and the surface of the projection 150 are flush with each other.

Referring again to FIG. 2, coating layers 170 can be respectively formed on the first surface 110 and the second surface 120 of the semiconductor chip 100. For example, the coating layers 170 can contain any one of a hydrophilic substance and a lipophilic substance.

In the case where a liquid phase gap-fill member which contains a hydrophilic substance is provided on the second surface 120, the coating layer 170 containing a hydrophilic substance is placed on the second surface 120. Unlike this depiction, it is also envisioned that in the case where a liquid phase gap-fill member which contains a lipophilic substance is provided on the second surface 120, the coating layer 170 containing a lipophilic substance is placed on the second surface 120.

Figure 5:
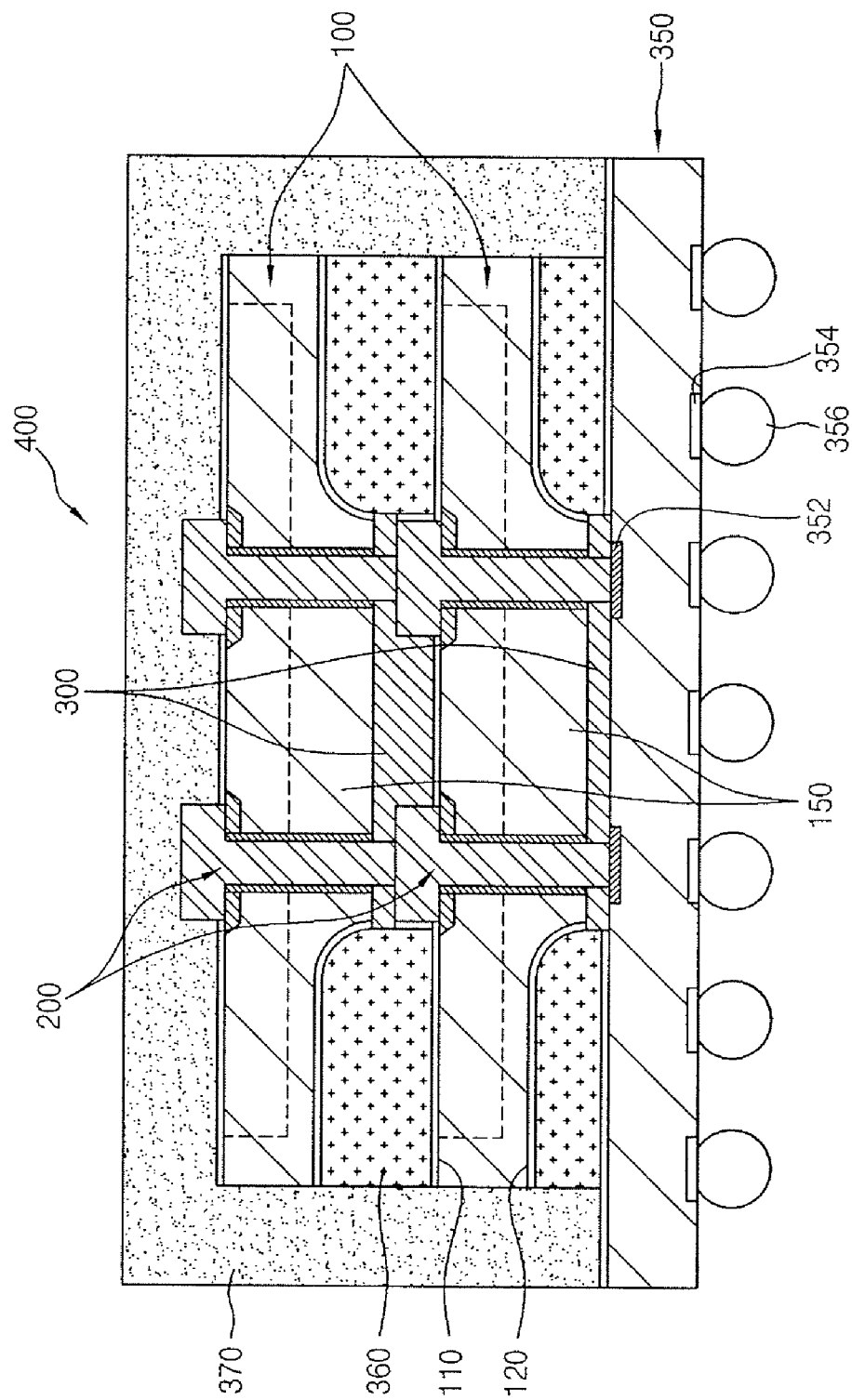
FIG. 5 is a sectional view illustrating a semiconductor package in accordance with a second embodiment of the present invention.

FIG. 5 is a sectional view illustrating a semiconductor package in accordance with a second embodiment of the present invention.

Referring to FIG. 5, a semiconductor package 400 includes at least two semiconductor chips 100, through-electrodes 200 which are formed through the semiconductor chips 100, a substrate 350, gap-fill members 360, and a molding member 370.

In the present embodiment, at least two semiconductor chips 100 are stacked upon each other. Each semiconductor chip 100 has a first surface 110 and a second surface 120 which faces away from the first surface 110. Bonding pads are formed on the first surface 110 of each semiconductor chip 100, and a projection 150 is formed on the second surface 120 of each semiconductor chip 100 to project from the second surface 120. In the present embodiment, the semiconductor chips 100 are arranged such that the first surface 110 of the lower semiconductor chip 100 and the second surface 120 of the upper semiconductor chip 100 face each other.

The semiconductor chips 100 have the through-electrodes 200. The through-electrodes 200 of the semiconductor chips 100 are placed at corresponding positions on projections 150 and are electrically connected with each other.

The stacked semiconductor chips 100 are attached to each other by the medium making up the reinforcing layer 300. The reinforcing layer 300 can comprise any one of a non-conductive adhesive (NCA), a non-conductive film (NCF) and a non-conductive polymer (NCP). When the reinforcing layer 300 comprises any one of an NCA, an NCF and an NCP, the through-electrodes 200 project from the projection 150 by the thickness of the reinforcing layer 300, and the reinforcing layer 300 has openings which expose the through-electrodes 200.

The substrate 350 includes connection pads 352, ball lands 354, and connection elements 356.

The connection pads 352 are formed on the upper surface of the substrate 350. The connection pads 352 are placed at positions which correspond to the through-electrodes 200 of the semiconductor chips 100. The connection pads 352 and the through-electrodes 200 are electrically connected with each other.

The ball lands 354 are placed on the lower surface of the substrate 350 which faces away from the upper surface. The ball lands 354 are electrically connected with the connection pads 352 by conductive vias, etc.

The connection elements 356 are placed on the ball lands 354. The connection elements 356 can comprise conductive balls such as solder balls.

The gap-fill members 360 are filled in the gaps defined between the first surface 110 of the lower semiconductor chip 100 and the second surface 120 of the upper semiconductor chip 100 and between the second surface 120 of the lower semiconductor chip 100 and the substrate 350. In the present embodiment, due to the fact that the projections 150 are formed on the second surfaces 120 of the semiconductor chips 100, a relatively large gap is defined between the lower and upper semiconductor chips 100. Therefore, the gap-fill member 360 can fill in these gaps between the semiconductor chips 100 while preventing or at least minimizing the occurrence voids.

The molding member 370 covers the substrate 350 and the semiconductor chips 100. A substance which can be used to form the molding member 370 includes epoxy resin.

Figure 6:
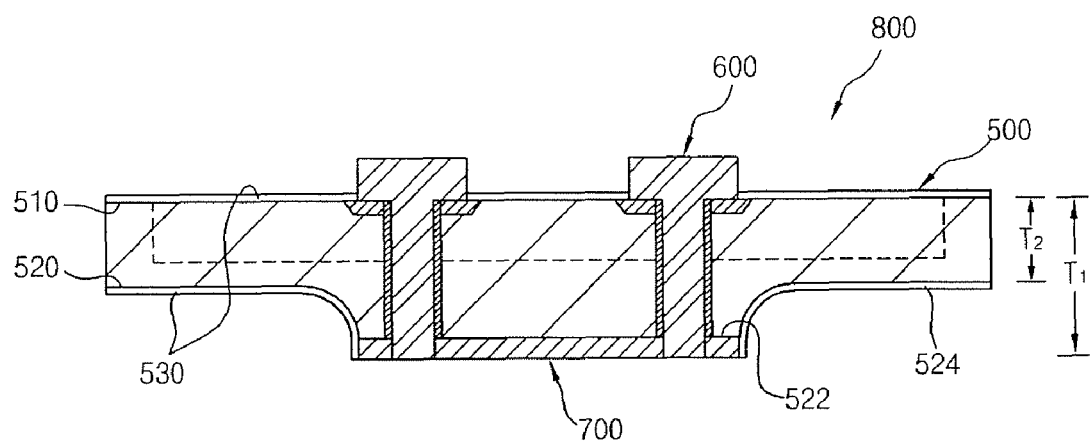
FIG. 6 is a sectional view illustrating a semiconductor package in accordance with a third embodiment of the present invention.

FIG. 6 is a sectional view illustrating a semiconductor package in accordance with a third embodiment of the present invention.

Referring to FIG. 6, a semiconductor package 800 includes a semiconductor chip 500 and through-electrodes 600. The semiconductor package 800 can further include a reinforcing layer 700.

For example, the semiconductor chip 500 has the shape of a rectangular hexahedron which possesses long sides and short sides. The semiconductor chip 500, which has the shape of a rectangular hexahedron, has a first surface 510 and a second surface 520 which face away from each other.

The first surface 510 of the semiconductor chip 500 is flat, and the second surface 520 of the semiconductor chip 500 has a flat part 522 and recessed parts 524. The semiconductor chip 500 has a first thickness T1 between the first surface 510 and the flat part 522 and a second thickness T2 between the first surface 510 and the recessed parts 524. The second thickness T2 is less than the first thickness T1.

In the present embodiment, the recessed parts 524 are formed, for example, through an etching process. Due to this etching process, the flat part 522 projects away from the recessed parts 524. In the present embodiment, the flat part 522 can be placed at the middle portion of the second surface 520. Alternatively, a plurality of flat parts can be placed on the second surface 520 in the form of a matrix pattern.

The through-electrodes 600 pass through the first surface 510 and the flat part 522. The ends of the through-electrodes 600 which correspond to the flat part 522 can project from the flat part 522 by a predetermined thickness. Unlike this, the ends of the through-electrodes 600 which correspond to the flat part 522 can be flush with the flat part 522, and bumps (not shown) or connection pads (not shown) can be placed on the ends of the through-electrodes 600. The reinforcing layer 700 can be attached to the flat part 522. The reinforcing layer 700 can include openings which expose the through-electrodes 600.

A coating layer 530, which contains a hydrophilic substance or a lipophilic substance, can be formed on the recessed parts 524 of the semiconductor chip 500.

At least two semiconductor chips 500 as illustrated in FIG. 6 can be stacked together. In this case, adjoining semiconductor chips 500 are placed such that the first surface 510 and the second surface 520 of them face each other.

The semiconductor package 800 can be electrically connected with the substrate 350, and a gap-fill member 360 can be placed between the semiconductor chips 500 as shown in FIG. 5.

As is apparent from the above description, in the present invention, advantages are provided in that a gap-fill member can be formed in a gap between semiconductor chips while preventing voids from being created in the gap without increasing the volume of a semiconductor package.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
a semiconductor chip comprising bonding pads and a projection, wherein the bonding pads are formed on a first surface of the semiconductor chip and the projection projects from a portion of a second surface of the semiconductor chip, wherein the second surface faces away from the first surface;
a reinforcing layer disposed on the projection;
through-electrodes passing through the first surface and the projection on the second surface, and passing through the reinforcing layer; and
guide members placed on the second surface of the semiconductor chip.

2. The semiconductor package according to claim 1, wherein the projection is disposed along a middle portion of the second surface and has a rectangular shape, and wherein the projection and the semiconductor chip are integrally formed with each other.

3. The semiconductor package according to claim 1, wherein a plurality of projections is disposed in a matrix pattern on the second surface, wherein the projections and the semiconductor chip are integrally formed with each other.

4. The semiconductor package according to claim 1, wherein the reinforcing layer comprises any one of a non-conductive adhesive (NCA), a non-conductive film (NCF) or a non-conductive polymer (NCP).

5. The semiconductor package according to claim 1, wherein the reinforcing layer comprises an anisotropic conductive film (ACF).

6. The semiconductor package according to claim 1, wherein the guide members are placed parallel to one of a short side or a long side of the semiconductor chip.

7. The semiconductor package according to claim 1, wherein the projection occupies about 5~25% of an overall area of the second surface.

8. The semiconductor package according to claim 1, wherein at least two through-electrodes pass through the semiconductor chip in correspondence to the projection.

9. The semiconductor package according to claim 1, further comprising bumps and pads placed on ends of the through-electrodes which correspond to the projection.

10. The semiconductor package according to claim 9, wherein the bumps and pads are formed of any one selected from the group consisting of solder, gold, copper and aluminum.

11. The semiconductor package according to claim 1, wherein at least two semiconductor chips are stacked together such that a first surface of a first semiconductor chip and a second surface of a second semiconductor chip are disposed facing each other.

12. The semiconductor package according to claim 11, further comprising a coating layer disposed between the first surface of the first semiconductor chip and the second surface of the second semiconductor chip, wherein the coating layer contains any one of a hydrophilic substance and a lipophilic substance.

13. The semiconductor package according to claim 11, further comprising a gap-fill member interposed between the stacked semiconductor chips, wherein the gap-fill member contains any one of a hydrophilic substance and a lipophilic substance.

14. A semiconductor package comprising:
a semiconductor chip having a first and second surface, bonding pads are disposed on the first surface, and the second surface having a flat part and a recess part, wherein the semiconductor chip has a first thickness when measured from the first surface to the flat part and has a second thickness when measured from the first surface to the recessed part such that the second thickness is less than the first thickness;
a reinforcing layer disposed on the flat part;
through-electrodes passing through the first surface and the flat part, and passing through the reinforcing layer; and
guide members placed on the second surface of the semiconductor chip.

15. The semiconductor package according to claim 14, wherein the guide members are placed parallel to one of a short side and a long side of the semiconductor chip.

16. The semiconductor package according to claim 14, wherein at least two semiconductor chips are stacked together such that a first surface of a first semiconductor chip and a second surface of a second semiconductor chip are disposed facing each other when stacked together.

17. The semiconductor package according to claim 16, further comprising a coating layer disposed between the first surface of the first semiconductor chip and the second surface of the second semiconductor chip, the coating layer containing any one of a hydrophilic substance and a lipophilic substance.

18. The semiconductor package according to claim 16, further comprising a gap-fill member interposed between the stacked semiconductor chips and containing any one of a hydrophilic substance and a lipophilic substance.

* * * * *